(12) United States Patent
Myers et al.

(10) Patent No.: US 7,243,705 B2
(45) Date of Patent: Jul. 17, 2007

(54) INTEGRATED CIRCUIT COOLANT MICROCHANNEL WITH COMPLIANT COVER

(75) Inventors: Alan M. Myers, Menlo Park, CA (US); Je-Young Chang, Phoenix, AZ (US); Ravi Prasher, Phoenix, AZ (US); Ioan Sauciuc, Phoenix, AZ (US); Gregory M. Chrysler, Chandler, AZ (US); Patrick D. Boyd, Aloha, OR (US); Chia-pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 77 days.

(21) Appl. No.: 11/069,540

(22) Filed: Mar. 1, 2005

(65) Prior Publication Data

US 2006/0196646 A1    Sep. 7, 2006

(51) Int. Cl.
*F28F 7/00*    (2006.01)
*H05K 7/20*    (2006.01)

(52) U.S. Cl. .................. 165/80.4; 165/46; 165/168
(58) Field of Classification Search ........... 165/80.4, 165/104.33, 46, 168, 104.26, 134.1, 81–82; 361/698, 699; 257/714, 715
See application file for complete search history.

(56) References Cited

U.S. PATENT DOCUMENTS

| | | | | |
|---|---|---|---|---|
| 4,341,432 A | * | 7/1982 | Cutchaw | 439/485 |
| 4,381,032 A | * | 4/1983 | Cutchaw | 165/46 |
| 4,685,512 A | * | 8/1987 | Edelstein et al. | 165/104.14 |
| 5,079,619 A | * | 1/1992 | Davidson | 257/714 |
| 5,949,648 A | * | 9/1999 | Liao | 361/700 |
| 6,514,412 B1 | * | 2/2003 | Insley et al. | 210/649 |
| 6,529,377 B1 | * | 3/2003 | Nelson et al. | 361/699 |
| 6,942,021 B2 | * | 9/2005 | Makino et al. | 165/104.26 |
| 2003/0180190 A1 | * | 9/2003 | Corcoran et al. | 422/102 |
| 2005/0077030 A1 | * | 4/2005 | Wong | 165/104.26 |
| 2005/0141195 A1 | * | 6/2005 | Pokharna et al. | 361/699 |

OTHER PUBLICATIONS

Holden, A. Matthew et al., "Microfluidic diffusion diluter: bulging of PDMS microchannels under pressure-driven flow", Institute of Physics Publishing, Journal of Micromechanics and Microengineering, J. Micromech. Microeng. 13 (2003), PII: S0960-1317(03)54541-7, pp. 412-418.

Lotters, J C et al., "The mechanical properties of the rubber elastic polymer polydimethylsiloxane for sensor applications", J. Micromech. Microeng. 7 (1997). PII: S0960-1317(97)83256-1, pp. 145-157.

Yang, Xing et al., "Design, Fabrication, and Testing of Micromachined Silicone Rubber Membrane Valves", Journal of Microelectromechanical Systems, vol. 8, No. 4, Dec. 1999, IEEE, pp. 393-402.

* cited by examiner

*Primary Examiner*—Tho Duong
(74) *Attorney, Agent, or Firm*—Buckley, Maschoff & Talwalkar LLC (57) ABSTRACT

An apparatus includes a microchannel structure having microchannels formed therein. The microchannels are to transport a coolant and to be proximate to an integrated circuit to transfer heat from the integrated circuit to the coolant. The apparatus also includes a cover positioned on the microchannel structure to define a respective upper wall of each of the microchannels. The cover presents a compliant surface to the microchannels.

2 Claims, 14 Drawing Sheets

INTEGRATED CIRCUIT COOLANT MICROCHANNEL WITH COMPLIANT COVER

BACKGROUND

As microprocessors advance in complexity and operating rate, the heat generated in microprocessors during operation increases and the demands on cooling systems for microprocessors also escalate. Also, it may be important that a microprocessor and cooling system be able to withstand cold temperatures (e.g., minus forty degrees Celsius). For example, a Personal Computer (PC) may be exposed to low temperatures while being shipped from a manufacturer to a distributor or retailer, or a laptop computer may be exposed to freezing temperatures when stored in a user's car overnight. Exposure to low temperatures may be a significant issue with respect to a cooling system that utilizes a liquid coolant.

Another issue that may be presented in a cooling system that utilizes a liquid coolant is localized increase in pressure if the coolant were to boil at the locus of a hotspot on the microprocessor die. Such an increase in pressure may interfere with uniform coolant flow and may thus compromise the cooling system.

DETAILED DESCRIPTION

Figure 1:
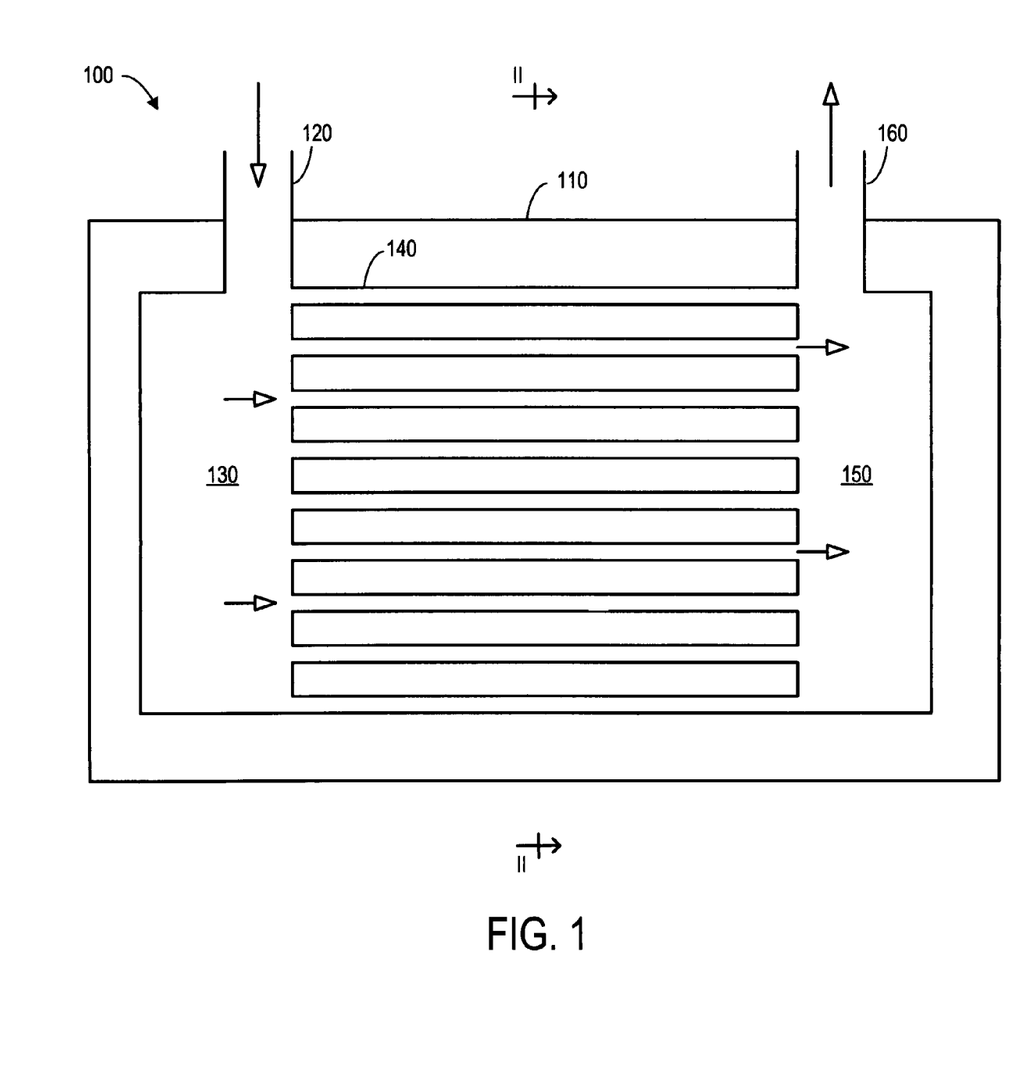
FIG. 1 is a schematic diagram of a system.

FIG. 1 is a block diagram of a system 100 including an Integrated Circuit (IC) 110. The IC 110 may be associated with, for example, an INTEL® PENTIUM IV processor. To help remove heat generated by transistors (not separately shown) located on the front-side (not shown) of the IC 110, a liquid coolant may be received in an inlet reservoir or chamber 130 through an inlet opening 120. For example, a pump may move the coolant through the inlet opening 120.

Microchannels may be formed directly in the rear surface of the IC 110 or may be formed in a separate piece of silicon or in a piece of copper that is eutectically (e.g.) bonded to the back of the IC 110. The IC 110 may be thinned to reduce thermal resistance between the transistors and the microchannels.

The inlet chamber 130 may comprise, for example, a manifold which opens into a number of channels 140 that lead to an outlet chamber 150 (e.g., another manifold). The coolant may flow through these channels 140 and then exit the outlet chamber 150 through an outlet opening 160. The channels 140 may be located proximate to the IC 110 to facilitate the removal of heat from the system 100. That is, heat may be transferred from the IC 110 to the coolant, which may then leave the system 100. The heated coolant may then cool at a remote location before returning to the system 100.

In a typical manner of implementing a microchannel cooling system, a hard, inflexible cover is bonded to the top of the microchannel assembly. The top cover may be made of glass, silicon, or metal. Bonding methods such as anodic, eutectic or direct bonding are typically used.

To efficiently facilitate a transfer of heat, a coolant with a relatively high thermal conductivity and high heat capacity may be used. Moreover, it may be beneficial if the coolant is relatively inexpensive and easy to pump. Note that water has a relatively high thermal conductivity, a relatively high heat capacity, is relatively inexpensive, and can be readily pumped. It may also be important that the system 100 be able to withstand cold temperatures (e.g., minus forty degrees Celsius). Note, however, that water expands in size when it freezes, and, as a result, the channels 140 may become damaged if water were to freeze therein. For example, the channels 140 may crack if water were to turn to ice therein.

Figure 2:
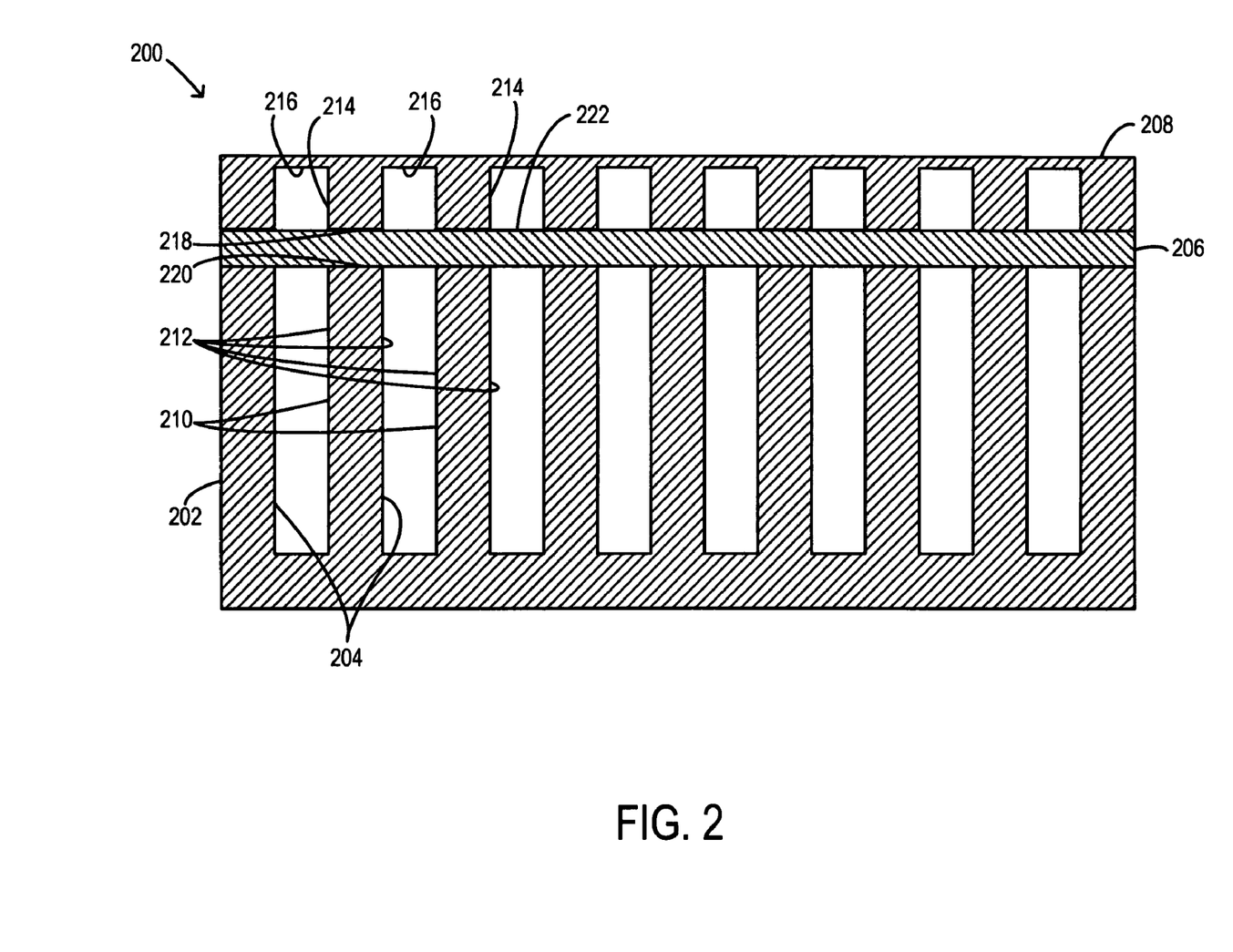
FIG. 2 is a schematic side cross-sectional view of a microchannel assembly according to some embodiments, the view taken at line II-II in FIG. 1.

FIG. 2 is a schematic side cross-sectional view of a microchannel assembly 200 according to some embodiments. The microchannel assembly 200 includes a microchannel structure 202 having microchannels 204 formed therein. The microchannels 204 are channels or passages each having a width of about 20 to 500 micrometers, although other widths may be used. The microchannels 204 transport (e.g., allow to flow therein) a coolant (not shown). The microchannel structure 202 may be any body, such as a metal or silicon cold plate in which microchannels are formed, and which is to be mounted on the back-side of a microchip (e.g., on an IC such as a microprocessor die) so that the microchannels are proximate to the IC to transfer heat from the IC to the coolant. The microchannel structure may alternatively be the microchip die itself having microchannels formed in a rear surface thereof.

In some embodiments, the microchannels 204 may have a height of about 300 microns and a width of about 100 microns, but other dimensions of the microchannels 204 are possible. In a practical embodiment, the number of microchannels may be much more than the relatively few microchannels depicted in the drawing. The microchannels may, but need not, all be straight and parallel to each other. In general, FIGS. 1 and 2 and the other drawings herein are not to scale.

The microchannel assembly 200 may also include a compliant membrane 206 which spans the microchannels 204. The membrane 206 may serve as a cover positioned on the microchannel structure 202 to define a respective upper wall 208 of each of the microchannels 204. Since the membrane 206 is compliant, it presents a compliant surface to the microchannels 204. As used herein and in the appended claims, "compliant" has its common meaning of bending or yielding in response to pressure.

The microchannel assembly 200 may also include a cap member 208 positioned on the microchannel structure 202 with the membrane 206 sandwiched between the cap member 208 and the microchannel structure 202. It will be noted that the microchannel structure 202 includes opposed walls 210 which define side walls 212 of the microchannels 204. The walls 210 may, but need not, all be of uniform width. The cap member 208 may also include opposed walls 214 to define relief channels 216 in the cap member 208. The walls 214 of the cap member 208 may each be aligned with, and may have the same width as, a respective one of the walls 210 of the microchannel structure 202. The membrane 206 is sandwiched between the lower surfaces 218 of the walls 214 and the upper surfaces 220 of the walls 210. Each relief channel 216 is located above a respective one of the microchannels 204, with the membrane 206 forming a bottom wall 222 of each relief channel 216. (As a matter of convention, the downward or vertical direction will be taken to be the direction from the microchannel assembly to the IC die.)

The membrane 206 may be adhered to the upper surfaces 220 of the walls 214 of the microchannel structure 202. In some embodiments, the membrane 206 may be formed of a material such as polydimethylsiloxane (PDMS) elastomer. According to one manner of forming the membrane, the microchannel structure 202 is filled with a 1% solution of agarose in water that has been heated above its melting point of about 85° C. Drain holes (not shown) in the bottom of the microchannel structure 202 may have been sealed with Capton tape or the like before introduction of the agarose solution. The microchannel structure is then allowed to cool so that the agarose gel solidifies. Thereafter, a layer of PDMS may be spin-coated on the surface formed by the solid agarose and the upper surfaces of the walls 214, and the resulting PDMS layer is then cured. The PDMS may be diluted up to about 40% with hexane so that the viscosity of the PDMS, and hence the thickness of the resulting membrane, can be controlled. The curing may vary as a function of the hexane concentration but may be in the range of 2-5 hours at 80° C. The thickness of the membrane may be chosen to provide mechanical strength as well as flexibility (compliance).

After the membrane is cured, the drain holes are unsealed and the microchannel structure is immersed in a bath of water at, e.g., 90° C. for about 5 minutes to melt the agarose gel and to allow the agarose to drain from the microchannel structure.

In accordance with another manner of making the microchannel assembly, a pre-fabricated PDMS membrane may be adhered to the upper surfaces of the walls 214 after cleaning the microchannel structure with methanol or the like. Whether the membrane is pre-fabricated or is cured in situ, the cap member 208 is mounted as shown in FIG. 2 with the PDMS membrane adhered to the microchannel structure. The cap member 208 may be formed of silicon or metal, for example. One way the cap member 208 may be bonded to the membrane 206, in the case where the cap member is made of silicon, may be by pressing the cap member and the microchannel structure together with the membrane in between with exposure to an oxygen plasma. Holes may be punched in the membrane to provide an inlet and an outlet for the coolant.

During normal operation, coolant such as water (not shown) is present in the microchannels 204 and flows therethrough to remove heat from the IC 110 (FIG. 1). In the event that the system 100 encounters freezing temperature while being stored or transported, the water in the microchannels 204 may freeze and expand, causing the membrane 206 to bulge upward into the relief channels 216. The bulging of the membrane 206 may allow the freezing and expansion of the water to occur without resulting in cracking, damage or breakage of the microchannel structure 202 itself. Thus the provision of the membrane and associated relief channels may allow the system 100 to endure freezing temperatures without suffering damage.

Also, the compliant membrane may be helpful in accommodating phase conversion of the coolant from liquid to vapor, as may occur over hotspots on the IC. This occurrence is referred to as two-phase flow. In a conventional, rigid microchannel, boiling of the coolant over a hotspot may result in an increase in pressure which may result in a decrease of coolant flow in the channel relative to other channels. Such a decrease in flow may compromise the cooling ability of the cooling system. However, if in accordance with embodiments described herein a compliant membrane forms the upper wall of the microchannel, the membrane may flex to relieve the pressure increase and to maintain the flow of coolant through all channels.

Figure 3:
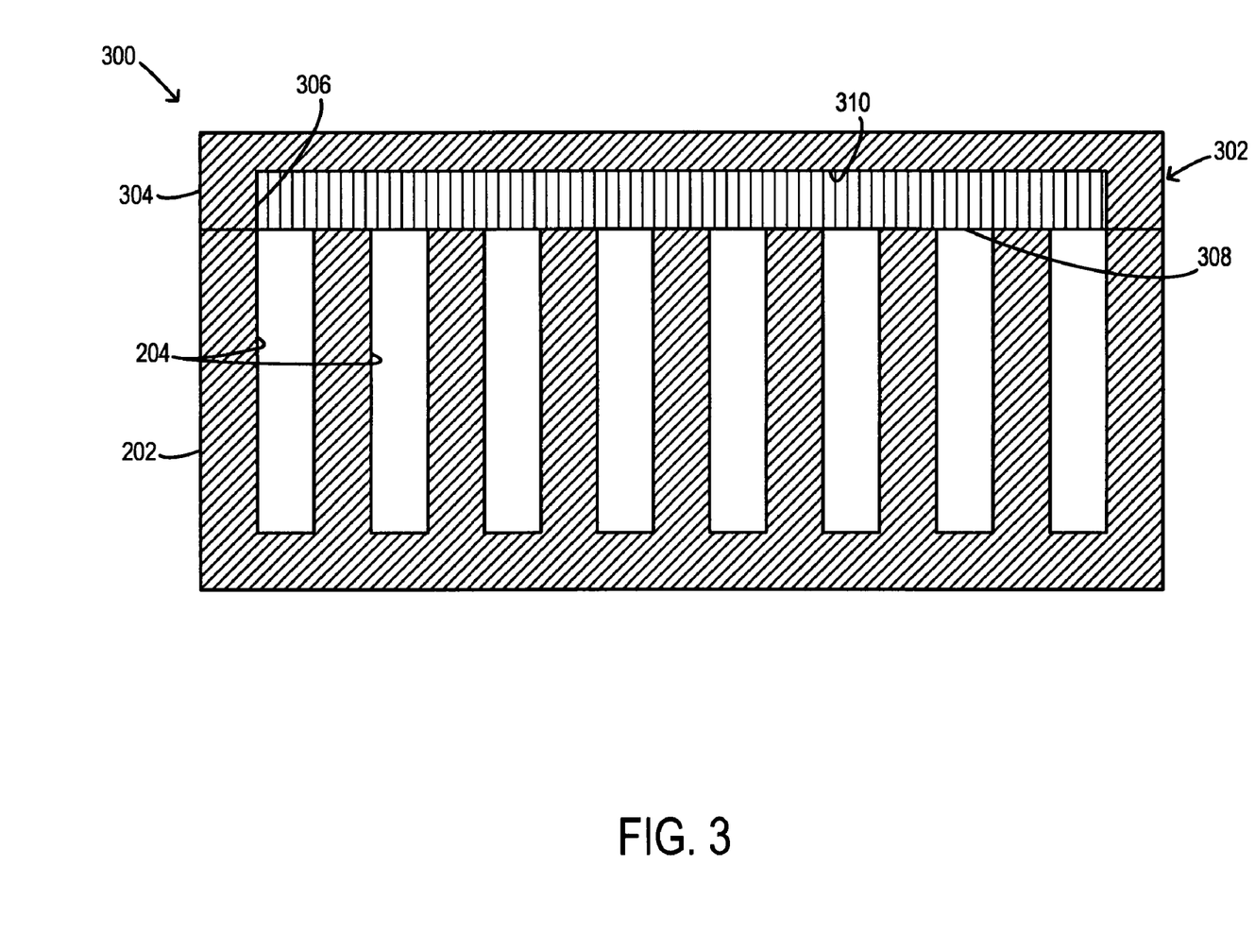
FIG. 3 is a view similar to FIG. 2 of a microchannel assembly according to some other embodiments.

FIG. 3 is a view similar to FIG. 2 of a microchannel assembly 300 according to some other embodiments.

The microchannel assembly 300 may include the same microchannel structure 202 that was described above in connection with FIG. 2. In addition, the microchannel assembly 300 includes a cover 302 positioned on the microchannel structure 202 to define the upper walls of the microchannels 204. The cover 302 is formed of a rigid cover member 304 (e.g., of metal or silicon) which has formed therein a downward-facing recess 306. The cover 302 also includes a pad 308 in the recess 306 and secured to the lower surface 310 of the rigid cover member 304. The pad 308 may be formed of rubber or another flexible material. The pad 308 may be formed of PDMS, for example. The securing of the pad 308 to the surface 310 may be by adhesive or by other means, including simply pressure applied to the pad from below by the microchannel structure 202. The pad 308 is compliant and thus presents a compliant surface to the microchannels 204. A space (not shown) may be provided above the pad 308 as part of the recess 306 to allow the pad 308 to flex into the recess if the coolant freezes. The cover 302 may be clamped to the microchannel structure 202 by a mechanical device (e.g., a clamp). A layer of titanium followed by a layer of gold may be deposited on the surfaces of the microchannel structure which contact the pad to prevent the pad from adhering to the microchannel structure. Again, if the system 100 encounters freezing temperatures so that the coolant in the microchannels freezes and expands, the expansion of the coolant may be accommodated by compression and yielding of the pad 308 so that the possibility of damage to the microchannel structure and/or to the cover may be reduced.

During normal operation, the pad may be tightly pressed between the microchannel structure and the cover so as to seal the tops of the microchannels.

Figure 4:
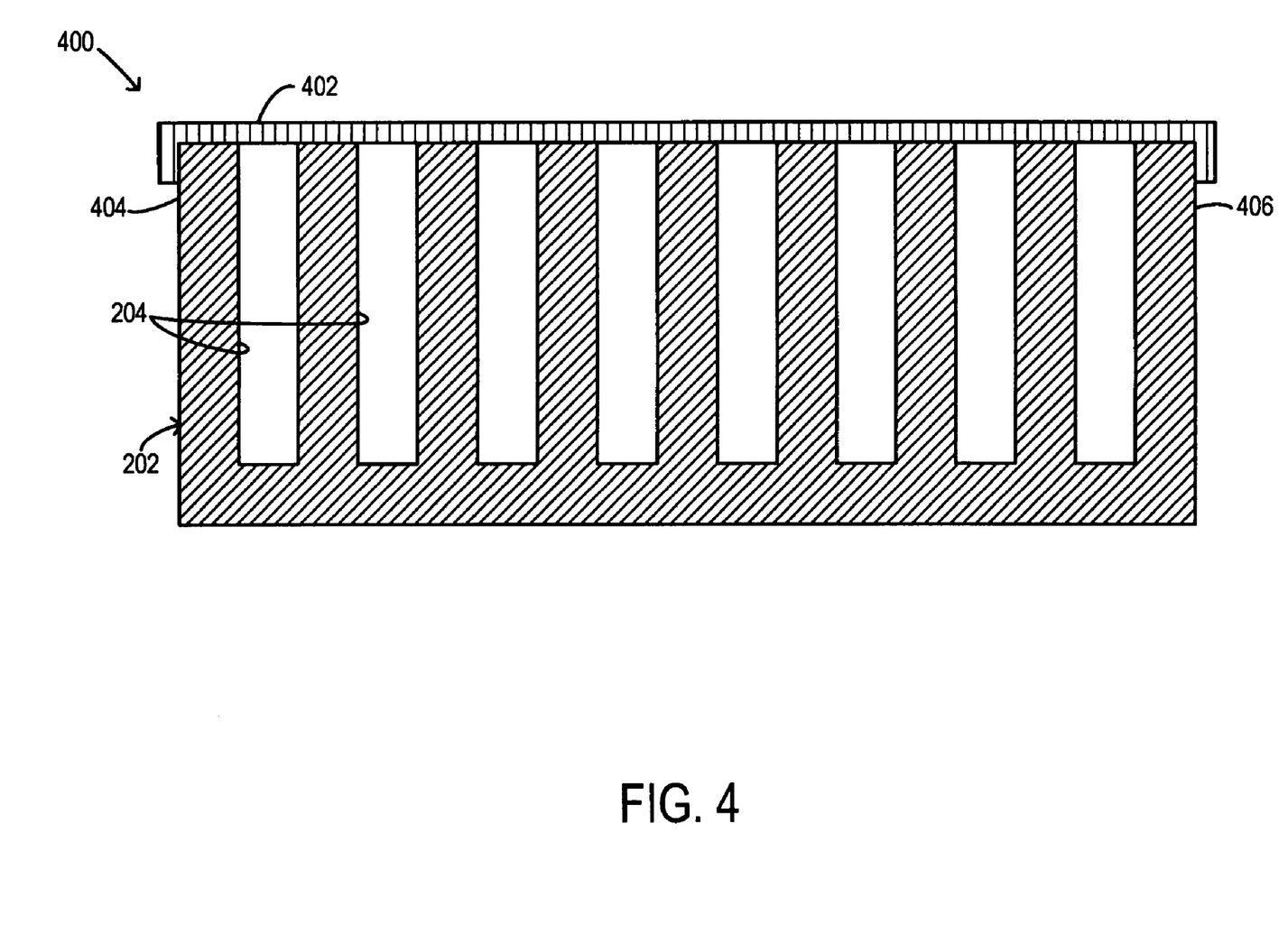
FIG. 4 is a view similar to FIGS. 2 and 3 of a microchannel assembly according to still other embodiments.

FIG. 4 is a view similar to FIGS. 2 and 3 of a microchannel assembly 400 according to still other embodiments.

Figure 5:
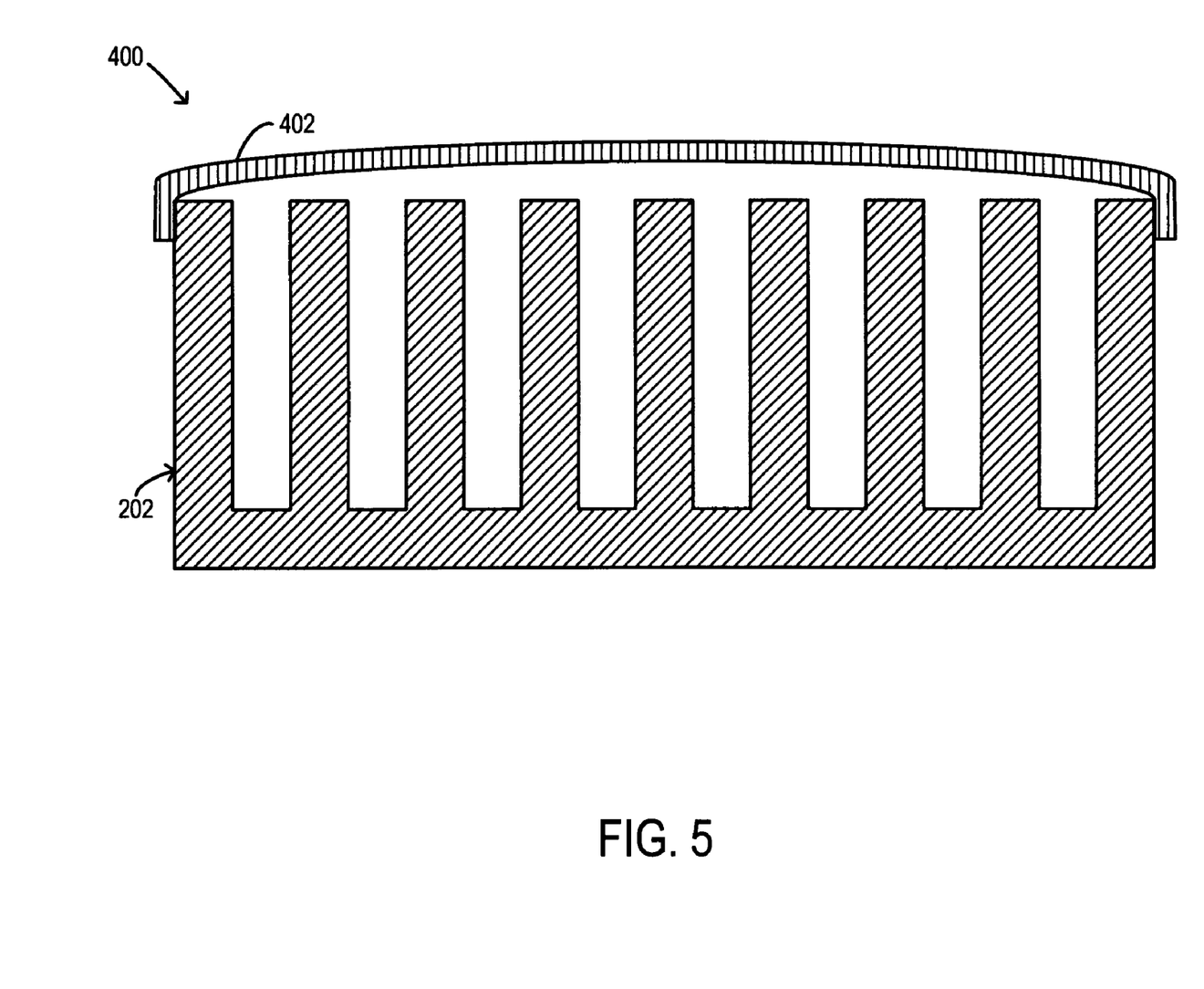
FIG. 5 is a view similar to FIG. 4 and showing the microchannel assembly of FIG. 4 in a condition to accommodate freezing of a coolant (not shown) therein.

The microchannel assembly 400 may include the same microchannel structure 202 that was described above in connection with FIG. 2. In addition, the microchannel assembly 400 includes a cover 402 which is formed of a flexible material such as plastic (e.g., Teflon) or bi-metal (e.g., copper-aluminum or aluminum-titanium). The cover 402 defines upper walls of the microchannels 204. The cover 402 is sealingly secured to the microchannel structure 202 at perimeter walls of the microchannel structure such as side walls 404, 406 and fore and aft walls which are not shown. Because the cover 402 is flexible, it presents a compliant surface to the microchannels. In the event of exposure of the system to freezing temperatures, the cover may flex upwardly, as illustrated in FIG. 5, to accommodate freezing and expansion of the coolant. Such flexing of the cover may also occur to accommodate local increases in pressure due to phase changes over hotspots during normal operation.

Figure 6:
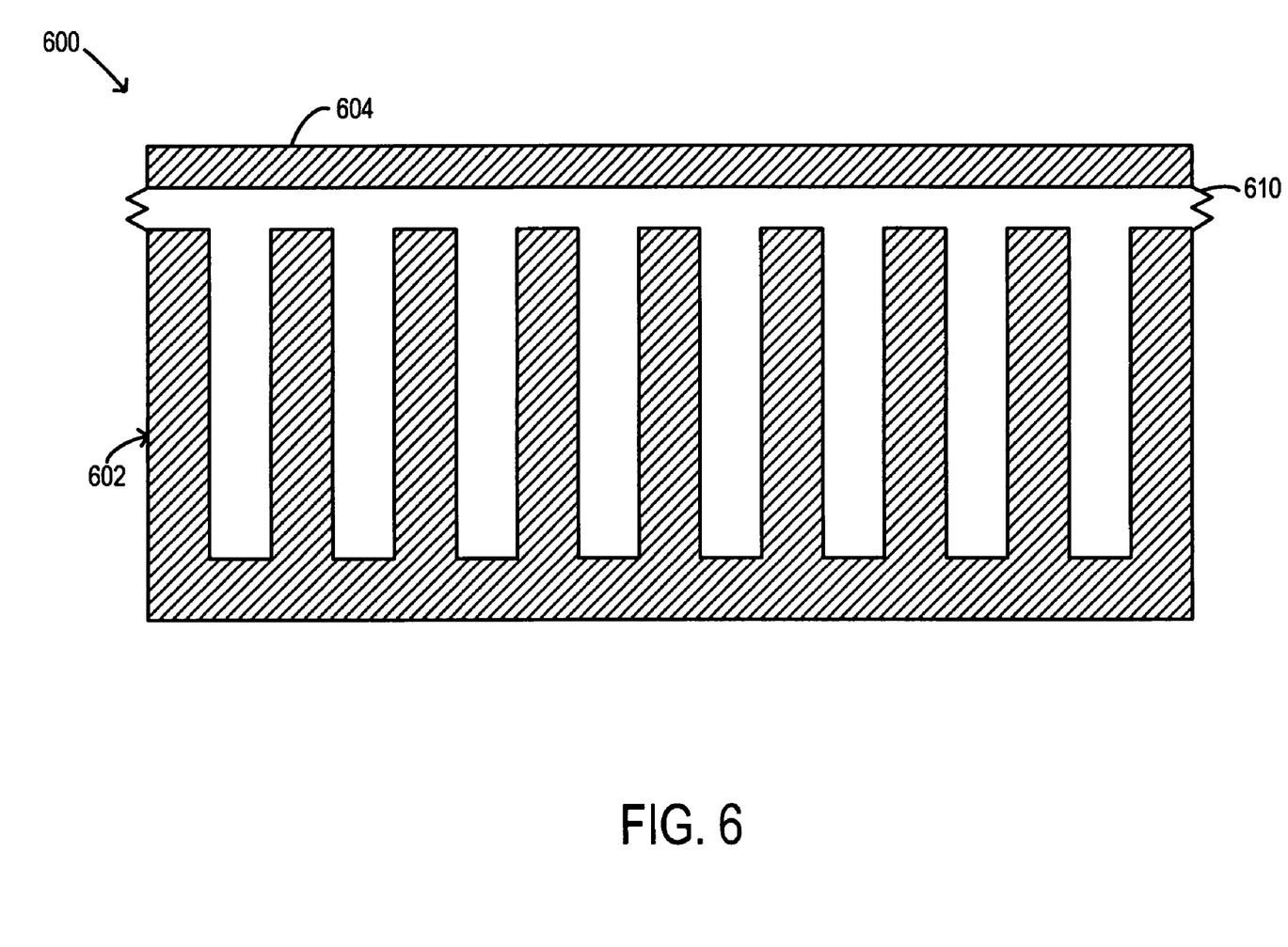
FIG. 6 is a view similar to FIGS. 2-4 of a microchannel assembly according to other embodiments, when in a condition to accommodate freezing of a coolant (not shown) therein.
Figure 7:
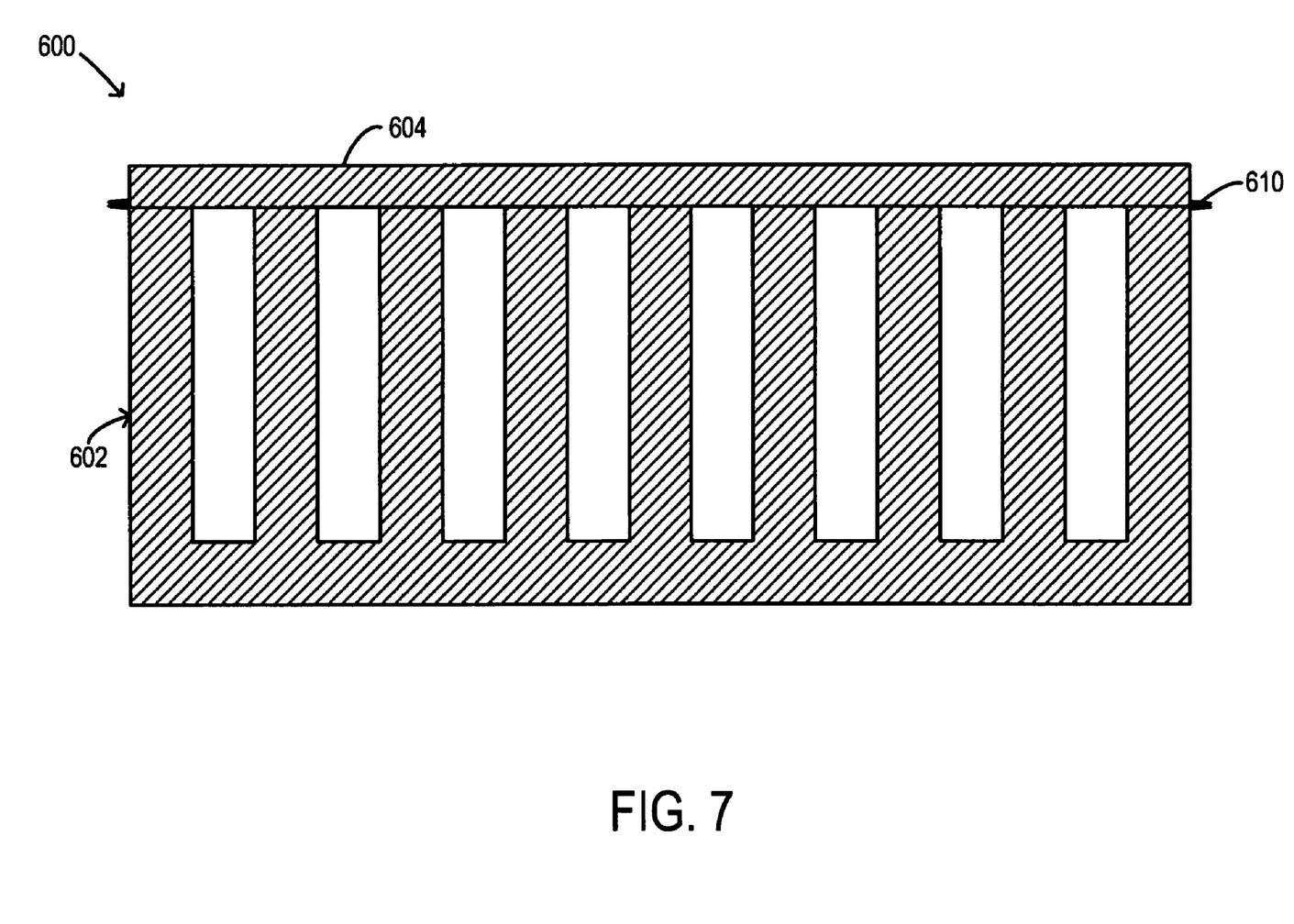
FIG. 7 is a view similar to FIG. 6, showing the microchannel assembly of FIG. 6 in a normal operating condition.
Figure 8:
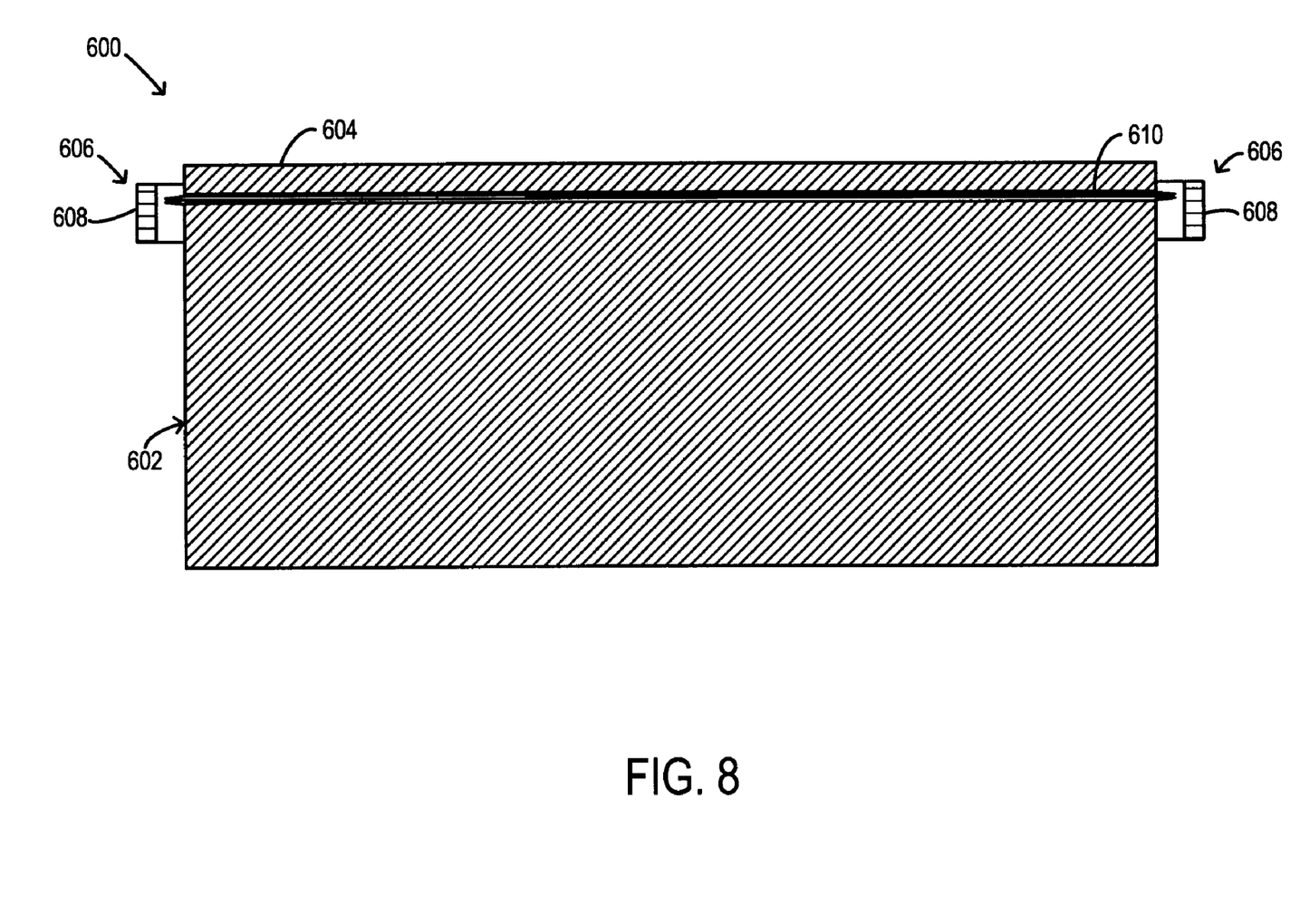
FIG. 8 is a front elevation view of the microchannel assembly of FIGS. 6 and 7 in a normal operating condition.

A microchannel assembly 600 according to still other embodiments is schematically illustrated in FIGS. 6-8. The microchannel assembly 600 may include a microchannel structure 602 and a cover 604. The microchannel structure 602 may be similar to the above-described microchannel structure 202 of other embodiments. FIG. 6 is a side cross-sectional view showing the microchannel assembly 600 in a condition in which freezing and expansion of coolant (not shown) has caused the cover 604 to be lifted upwardly from the microchannel structure 602. FIG. 7 is a view similar to FIG. 6, but showing the microchannel assembly 600 in a normal operating condition with the cover 604 positioned on the microchannel structure 602 to define upper walls of the microchannels. FIG. 8 is a front elevation view of the microchannel assembly 600 in the normal operating condition.

The cover 604 may be a rigid member of silicon or metal, for example. Referring to FIG. 8, the microchannel assembly 600 may further include a bias mechanism 606 that may be constituted, for example, of two springs 608 each mounted at a respective side of the microchannel assembly 600 and attached to the microchannel structure 602 and to the cover 604 and tensioned to downwardly bias the cover 604 toward the microchannel structure 602. The tensioning of the springs 608 may be such as to allow the cover 602 to be compliant to a force applied (e.g., by expansion of the coolant upon freezing) upwardly to the cover 604 from the microchannels. Thus, by virtue of the manner in which it is mounted, the cover may present a compliant surface to the microchannels.

Although only two springs are shown in the drawing, in some embodiments the bias mechanism may include a different number of springs, such as four springs (e.g., one mounted at each side of the microchannel assembly or one mounted at each corner of the microchannel assembly) or one spring (e.g., mounted interiorly of the cover at a central location thereof).

The microchannel assembly 600 may also include a bellows 610, made of foil or the like, which joins a lower periphery 612 (FIG. 6) of the cover 604 to an upper periphery 614 of the microchannel structure 602 to seal the gap that may be formed when the cover is lifted and thus to prevent the coolant from escaping between the cover and the microchannel structure.

The manner of mounting the cover in this embodiment may allow for accommodation of freezing of the coolant and thus may prevent such freezing from causing damage to the cover and/or to the microchannel structure.

Figure 8A:
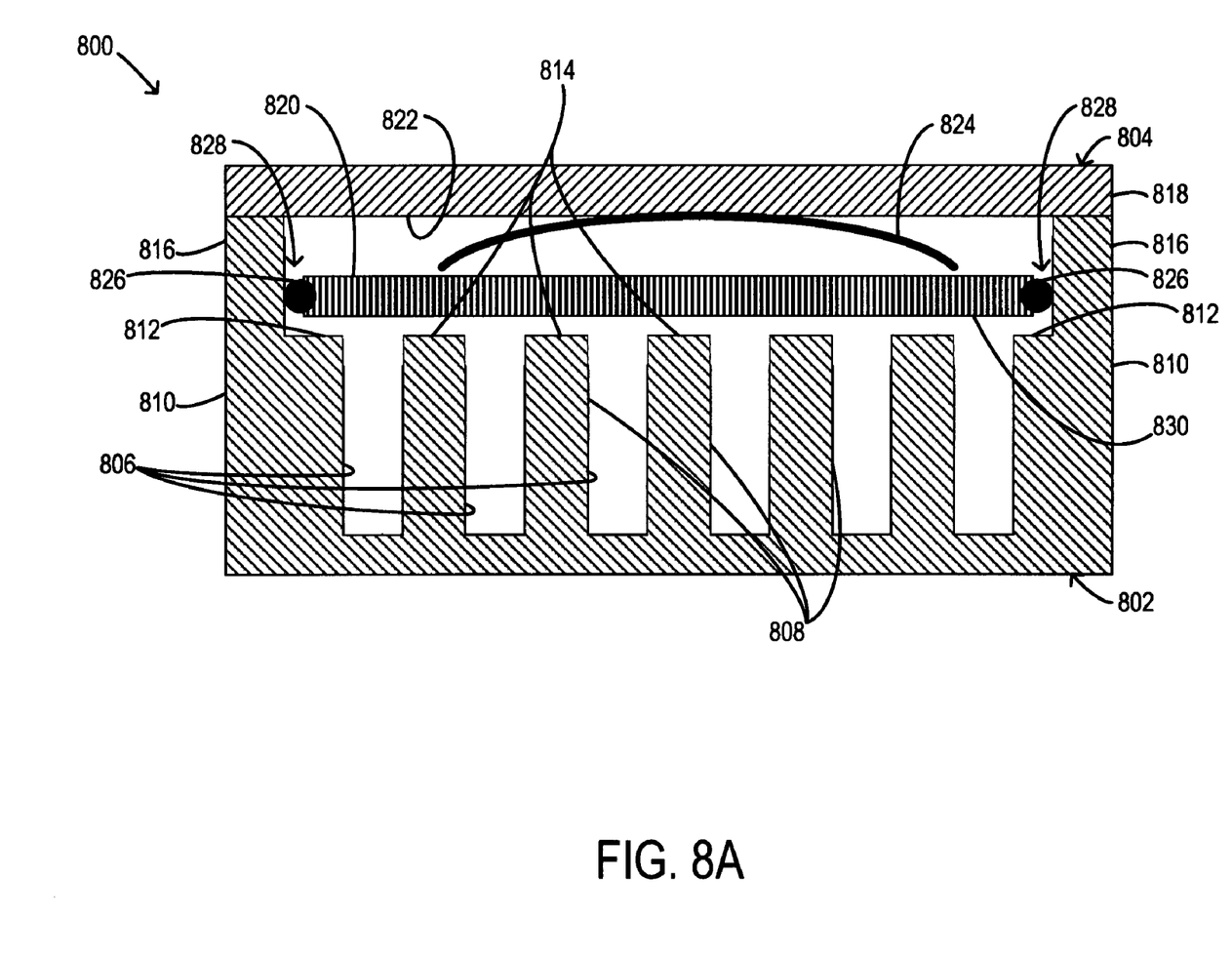
FIG. 8A is a view similar to FIGS. 2-4, 6 and 7 of a microchannel assembly according to additional embodiments, when in a condition to accommodate freezing of a coolant (not shown) therein.

FIG. 8A is a view similar to FIGS. 2-4 and 6 showing a microchannel assembly 800 in a condition to accommodate freezing and expansion of coolant (not shown).

The microchannel assembly 800 includes a microchannel structure 802 and a multi-part cover 804 positioned on (e.g., bonded to) the microchannel structure 802. The microchannel structure 802 has microchannels 806 formed therein. Interior opposed walls 808 of the microchannel structure 806 define side walls of the microchannels 806. The exterior walls 810 of the microchannel structure 802 are stepped and each include a step surface 812 which is co-planar with the upper surfaces 814 of the interior walls 808. The exterior walls 810 also include upward extensions 816 which extend upwardly beyond the plane defined by step surfaces 812 of the walls 810 and upper surfaces 814 of the walls 810.

The multi-part cover 804 includes an upper member 818 which may be generally planar and which spans the upward extensions 816 of the walls 810. The cover 804 further includes a lower member 820 mounted to a lower surface 822 of the upper member 818 by a leaf spring 824. The lower member 820 of the cover 804 may be generally planar and spans the step surfaces 812 of the walls 810. The cover 804 also includes an O-ring 826 mounted around a horizontal perimeter of the lower member 820 to sealingly close a gap 828 between the lower member 820 and the upward extensions 816 of the walls 810.

The leaf spring 824 functions as a bias mechanism to downwardly bias the lower member 820 toward the upper surfaces 814 of the walls 808 and the step surfaces 812 of the walls 810 so that, during normal operation (a condition not illustrated in FIG. 8A), the lower member 820 closes the tops of the microchannels 806 and defines the upper walls of the microchannels 806. Because of the manner of mounting the lower member 820, the lower surface 830 of the lower member 820 is presented as a compliant surface to the microchannels 806 so that in the event of freezing of the coolant (not shown), expansion of the coolant may force the lower member 820 upward against the force of the leaf spring 824 to a condition, such as that illustrated in FIG. 8A. Thus the spring-mounted member 820 may accommodate freezing and expansion of the coolant to allow such expansion to occur with reduced risk of damage to the microchannel assembly.

Figure 9:
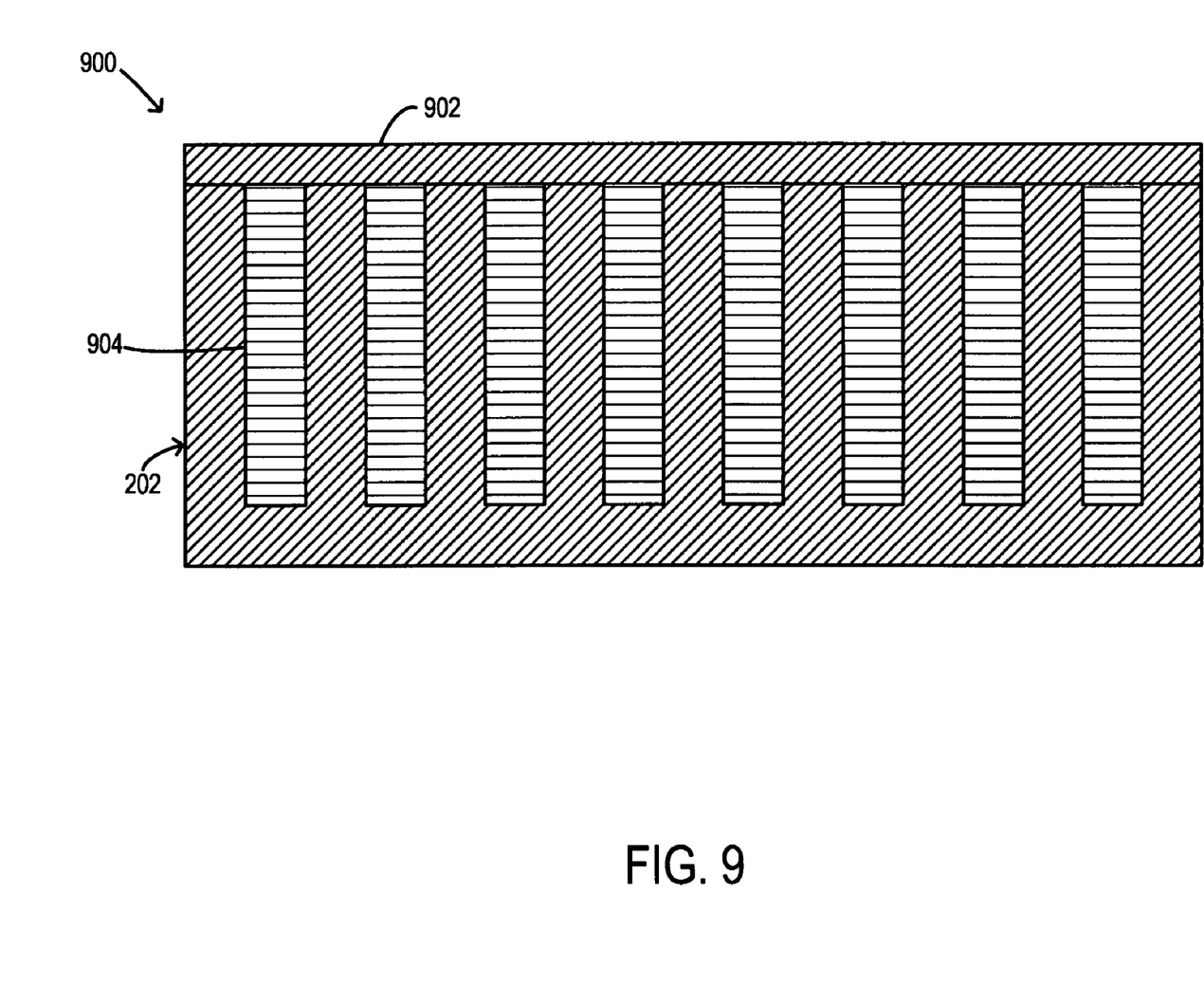
FIG. 9 is a view similar to FIGS. 2-4 and 6 of a microchannel assembly according to still other embodiments, in a condition in which coolant is expelled from the microchannel assembly.
Figure 10:
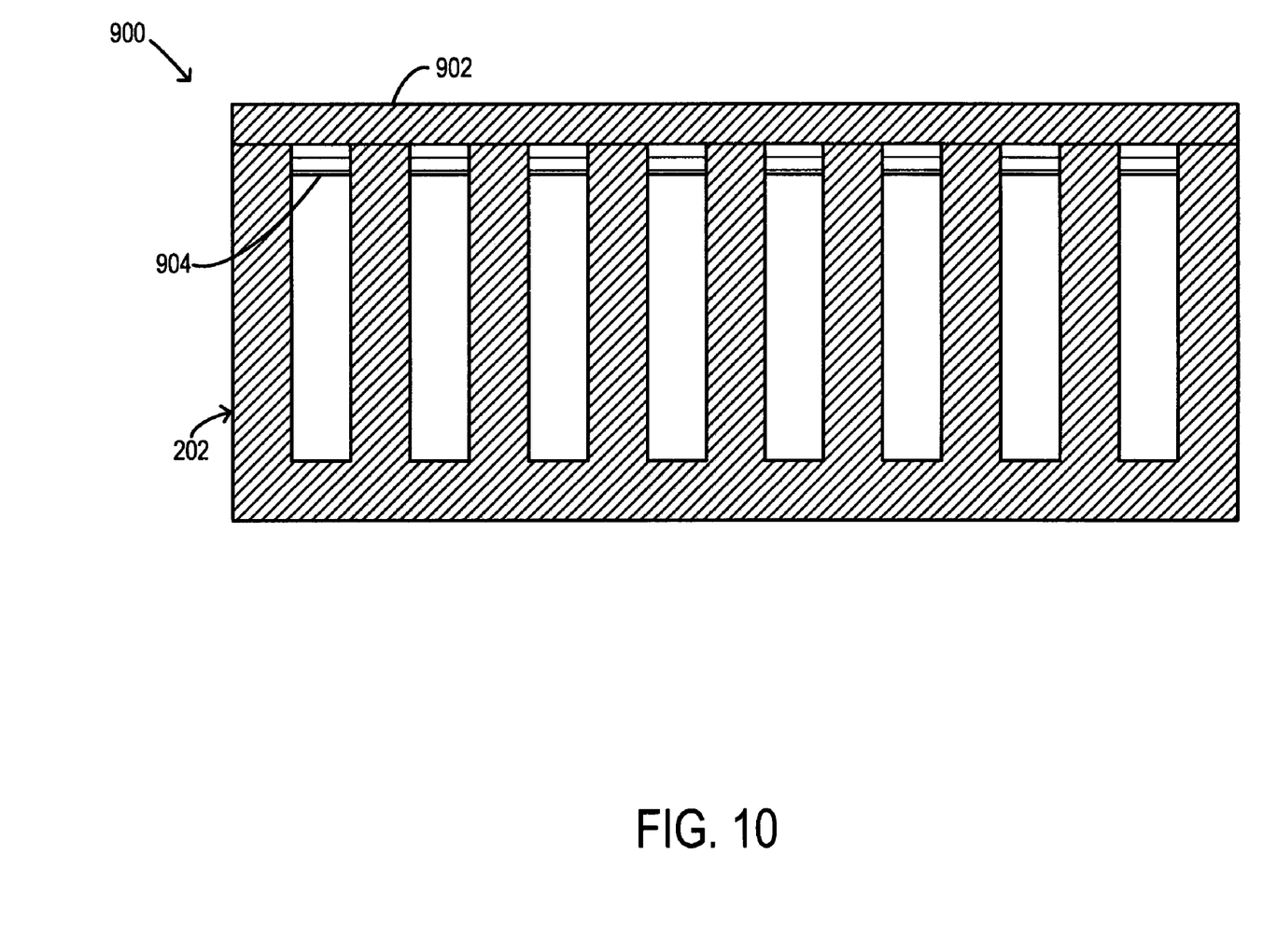
FIG. 10 is a view similar to FIG. 9, showing the microchannel assembly of FIG. 9 in a condition in which coolant (not shown) is present in the microchannel assembly.

FIG. 9 is a view similar to FIGS. 2-4 and 6 of a microchannel assembly 900 according to still other embodiments, in a condition in which coolant is expelled from the microchannel assembly. FIG. 10 is a view similar to FIG. 9, showing the microchannel assembly 900 in a condition in which coolant (not shown) is present in the microchannel assembly.

The microchannel assembly 900 may include the same microchannel structure 202 as in previous embodiments and may also include a cover 902 which may be a rigid member, like cover 604 (FIG. 6) but fixedly and liquid-tightly secured to close the microchannels and to define the upper walls of the microchannels. In addition, the microchannel assembly 900 includes a filler material 904, such as n-isopropylacrylamide (NIPAM) which is present in the microchannels. The NIPAM is a polymer which exhibits shrinking to a great extent upon exposure to heat. For example, upon a suitable increase in temperature NIPAM shrinks to about one-tenth of its previous size. At a relatively low temperature, below 40° C., the NIPAM occupies enough space to completely obstruct the microchannels in the microchannel assembly 900. As the temperature rises above 40° C., the NIPAM shrinks to substantially one-tenth of its previous size and so is in a condition such that the microchannels are substantially unobstructed. The NIPAM is a solid in both conditions.

Before beginning operation, the NIPAM is in its low-density, high space occupancy state and the microchannels are completely filled and obstructed by the NIPAM (FIG. 9). As operation of the system begins, the IC (not shown in FIGS. 9 and 10) generates heat and warms the NIPAM to a temperature at which the NIPAM drastically shrinks (FIG. 10) and allows the coolant to be circulated through the microchannels. The shrinking of the NIPAM occurs at around 40° C., which is well below the temperature (e.g., 100° C.) at which cooling of the IC begins to be needed, so that the presence of the NIPAM does not interfere with cooling operation of the system which includes the microchannel assembly.

When operation of the system ceases and the IC and the microchannel assembly cool off, the NIPAM expands to its full size, forcing substantially all of the coolant out of the microchannels. Consequently, in the event that the system is thereafter exposed to freezing temperatures, there will be substantially no coolant in the microchannels to damage the microchannels by freezing and expansion.

In some embodiments, the NIPAM may be adhered to a lower surface of the cover 902 at the locus of the microchannels (i.e., the NIPAM may be adhered to the upper walls of the microchannels). In other embodiments, the NIPAM may be adhered to one or more other walls of the microchannels, in addition to or instead of being adhered to the cover. However, it may be the case, if the NIPAM is adhered to more than one surface, that shrinking of the NIPAM upon heating thereof may pull the NIPAM away from one or more of the surfaces and/or may adversely affect the structural integrity of the NIPAM. In some embodiments, the NIPAM may be adhered to the lower surface of the cover and/or to one or more other walls of the microchannels by means of an interface of elastic fibers. It may be advantageous to adhere the NIPAM only to the lower surface of the cover, since if the NIPAM is present on the side or bottom walls of the microchannel structure, the NIPAM may reduce heat transfer from the microchannel structure to the coolant.

In some embodiments, inlets and or outlets (both not shown) in the cover may be positioned to coincide with hotspots on the IC die, since the NIPAM will remain in its "hot" shrunken condition longest at these locations, allowing the coolant to flow out of the inlets/outlets.

Figure 11:
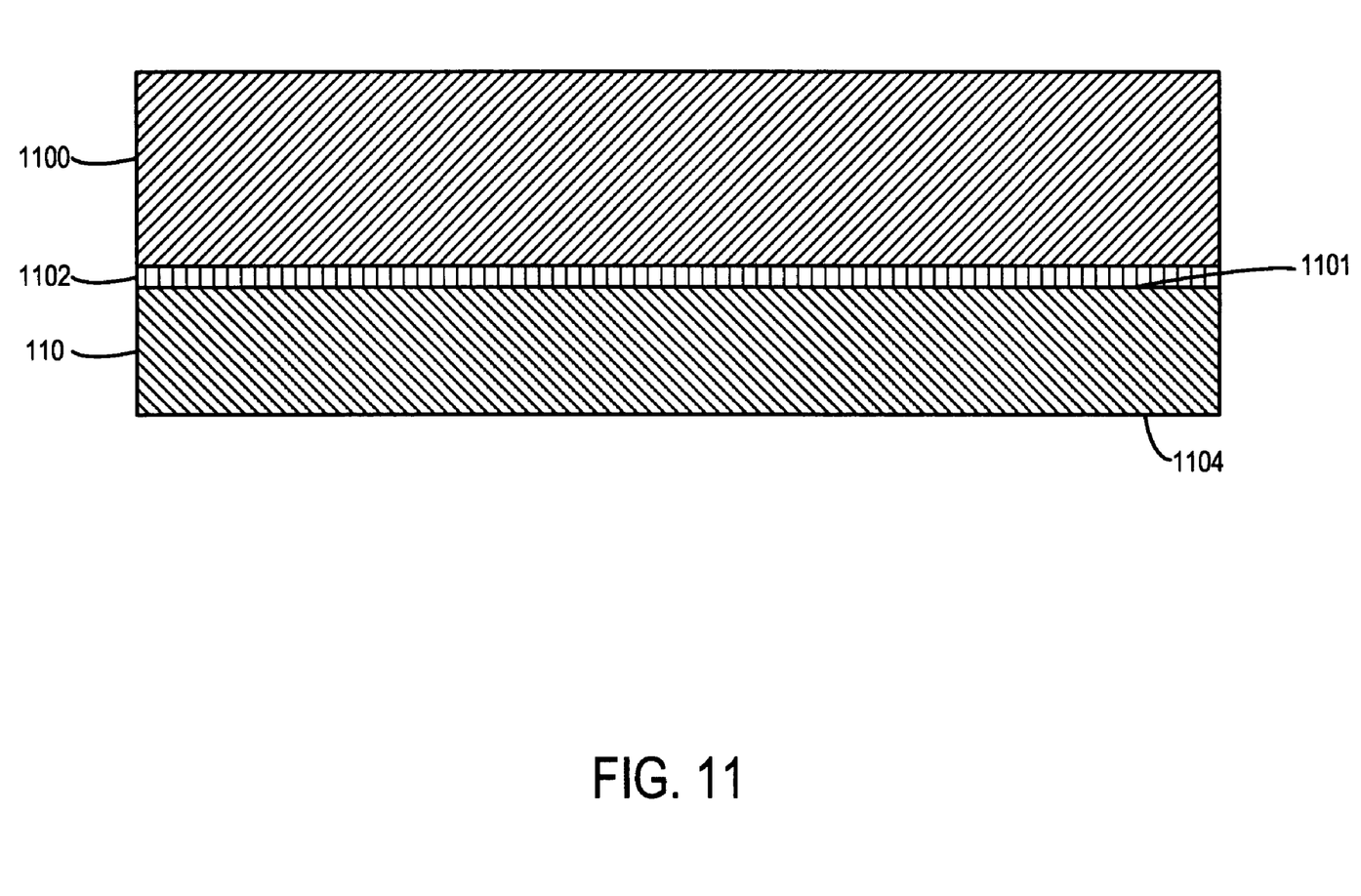
FIG. 11 is a schematic side view of an integrated circuit die having mounted thereon a microchannel assembly in accordance with one of FIGS. 2-10.

FIG. 11 is a schematic side view of an integrated circuit die 110 with a microchannel assembly 1100 mounted thereon. The microchannel assembly 1100 may be any one of the types of microchannel assembly described hereinabove. The microchannel assembly 1100 may be bonded to the back-side 1101 of the integrated circuit die 110 by, e.g., a layer of thermal interface material (TIM) 1102 to thermally couple the microchannel assembly 1100 to the integrated circuit die 110. In other embodiments, the microchannel assembly may be thermally coupled in another manner to the integrated circuit die. The transistors (not separately shown) of the IC die 110 are formed at the front side 1104 of the IC die 110.

In other embodiments, the microchannels may be formed directly in the rear-side of the IC die, so that the microchannel structure and the IC die are one integrated piece. In these embodiments, no TIM would be required, and a cover like one of the covers described above may be provided to accommodate freezing and/or boiling of the coolant.

Figure 12:
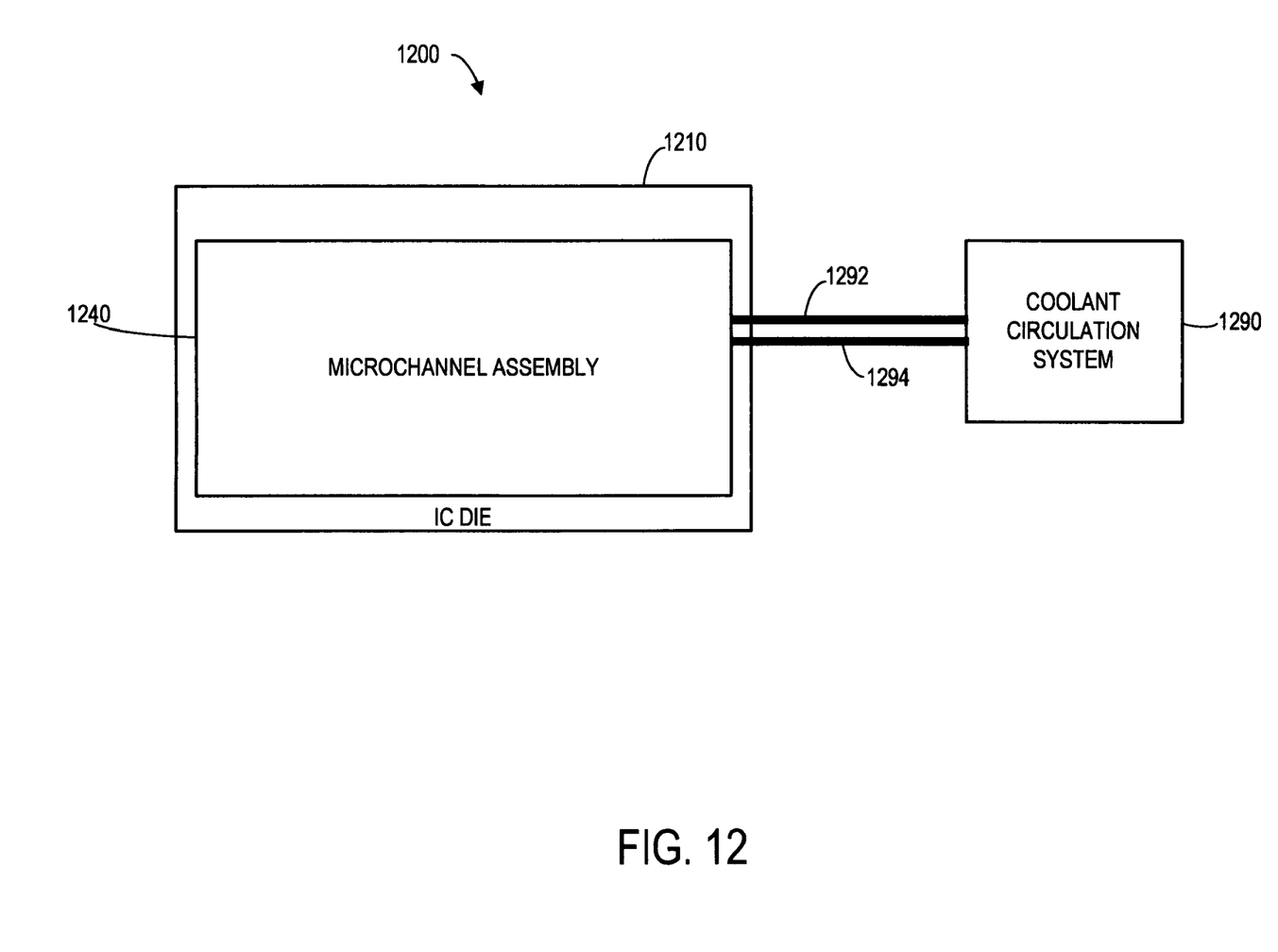
FIG. 12 is a block diagram showing a die with additional components of a cooling system according to some embodiments.

FIG. 12 is a block diagram showing an IC die 1210 and additional components of a cooling system 1200. For purposes of illustration the microchannel assembly 1240 (which may be any one of the microchannel assemblies described above) is shown as a single block. The cooling system 1200 includes a coolant circulation system 1290 to supply the coolant to the microchannel assembly 1240. The coolant circulation system 1290 may be in fluid communication with the microchannel assembly 1240 via one or more coolant supply channels or lines 1292 and one or more coolant return channels 1294. Although not separately shown, a pump and a heat exchanger located remotely from the die 1210 may be included in the coolant circulation system 1290.

Coolant supplied by the coolant circulation system 1290 may flow through the microchannels of the microchannel assembly 1240 at or above the rear surface of the IC die 1210 to aid in cooling the IC die 1210. In some embodiments, the coolant is operated with two phases—liquid and vapor. That is, in some embodiments at least part of the coolant in the microchannels is in a gaseous state. In other embodiments, the coolant is single phase—that is, all liquid. In either case, the microchannel assembly accommodates freezing of the coolant while reducing the possibility of damaging the microchannel assembly as a result of the freezing, or expels the coolant from the microchannels to prevent damage from freezing.

Figure 13:
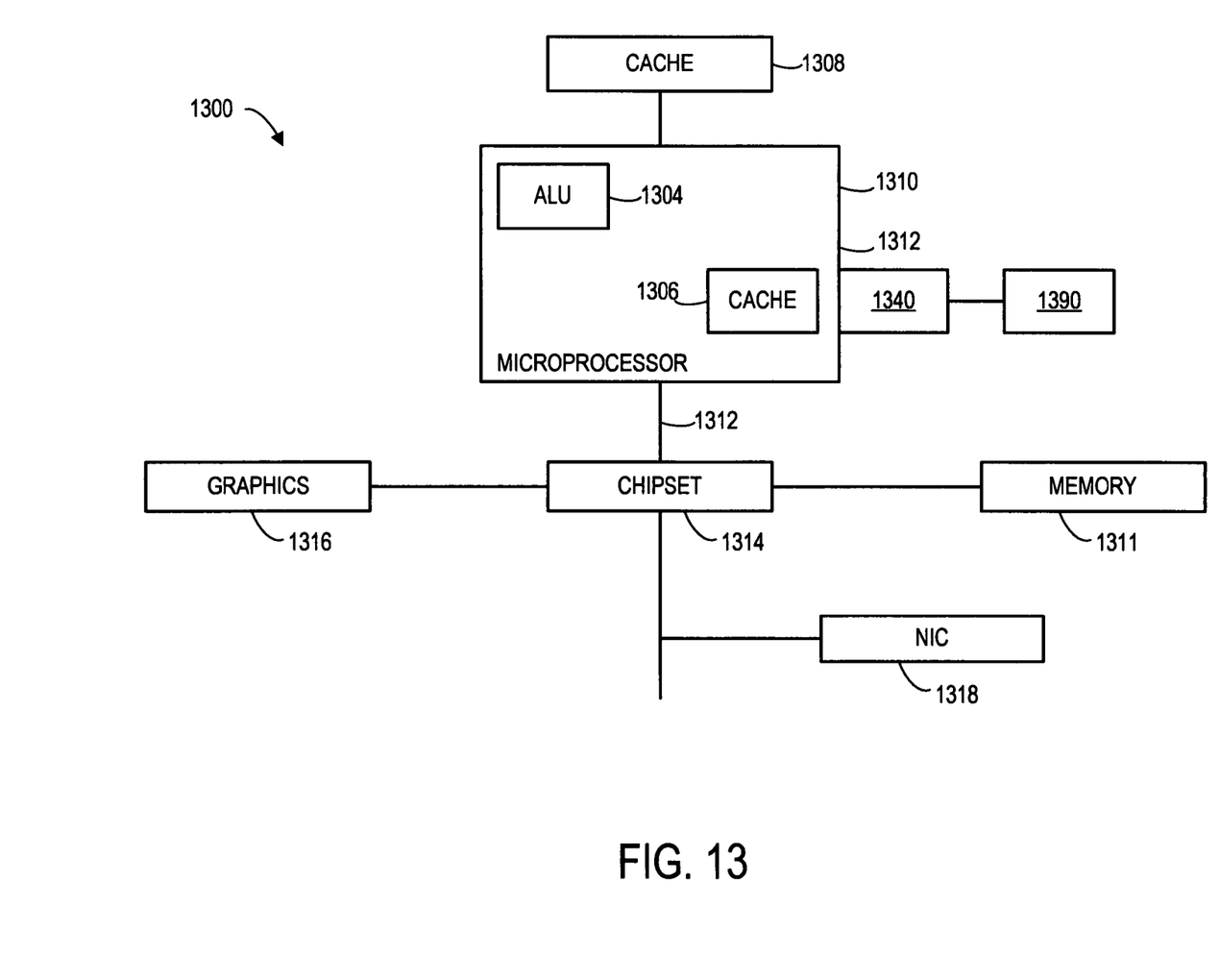
FIG. 13 is a block diagram of a computer system according to some embodiments that includes an example of an integrated circuit die associated with a cooling system as in one or more of FIGS. 2-12.

The IC die 1210 may be associated with a microprocessor in some embodiments. FIG. 13 is a block diagram of a system 1300 in which such a die 1310 may be incorporated. In particular, the die 1310 includes many sub-blocks, such as an Arithmetic Logic Unit (ALU) 1304 and an on-die cache 1306. The microprocessor on die 1310 may also communicate to other levels of cache, such as off-die cache 1308. Higher memory hierarchy levels, such as system memory 1311, may be accessed via a host bus 1312 and a chipset 1314. In addition, other off-die functional units, such as a graphics accelerator 1316 and a Network Interface Controller (NIC) 1318, to name just a few, may communicate with the microprocessor on die 1310 via appropriate busses or ports.

The IC die 1310 may be cooled in accordance with any of the embodiments described herein. For example, a pump 1390 may circulate a coolant (e.g., including water) through a cold plate 1340 proximate to the IC die 1310 and having at least one microchannel to transport the coolant. Moreover, an arrangement to reduce or prevent damage due to freezing may be provided in accordance with any of the embodiments described above.

The system architecture shown in FIG. 13 is exemplary; other system architectures may be employed.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. An apparatus comprising:
a microchannel structure having microchannels formed therein, said microchannels to transport a coolant and to be proximate to an integrated circuit to transfer heat from the integrated circuit to the coolant;

a membrane positioned on the microchannel structure to define a respective upper wall of each of said microchannels, said membrane presenting a compliant surface to said microchannels; and a cap member positioned on said microchannel structure with said membrane sandwiched between said cap member and said microchannel structure, said cap member defining a plurality of relief channels each located above a respective one of said microchannels, said membrane forming a bottom wall of each of the relief channels, said relief channels for allowing said membrane to bulge into said relief channels in case said coolant freezes and expands in one or more of said microchannels;

wherein said membrane is formed of polydimethylsiloxane elastomer.

2. The apparatus of claim 1, wherein said cap member is formed of silicon.

* * * * *